United States Patent [19]
Murden

[11] Patent Number: 5,550,492
[45] Date of Patent: Aug. 27, 1996

[54] ANALOG TO DIGITAL CONVERTER USING COMPLEMENTARY DIFFERENTIAL EMITTER PAIRS

[75] Inventor: Frank Murden, Greensboro, N.C.

[73] Assignee: Analog Devices, Inc., Norwood, Mass.

[21] Appl. No.: 347,910

[22] Filed: Dec. 1, 1994

[51] Int. Cl.⁶ .............................. H03K 5/24; H03M 1/72
[52] U.S. Cl. .......................... 327/65; 327/560; 327/563; 341/159; 341/161
[58] Field of Search ................................. 327/52, 65, 89, 327/104, 306, 560, 563; 330/252, 253, 254, 311; 341/156, 159, 161

[56] References Cited

U.S. PATENT DOCUMENTS

| | | | |
|---|---|---|---|
| 4,005,410 | 1/1977 | Michael et al. | 340/347 |
| 4,599,602 | 7/1986 | Matzuzawa et al. | 341/161 |
| 4,931,797 | 6/1990 | Kagawa et al. | 327/77 |
| 5,126,742 | 6/1992 | Schmidt et al. | 341/156 |
| 5,198,781 | 3/1993 | Kusakabe | 330/257 |
| 5,307,067 | 4/1994 | Kimura et al. | 341/159 |
| 5,313,207 | 5/1994 | Kouno et al. | 341/156 |
| 5,392,045 | 2/1995 | Yee | 327/65 |
| 5,399,988 | 3/1995 | Knierim | 330/252 |

FOREIGN PATENT DOCUMENTS

| | | | |
|---|---|---|---|
| 1955555 | 11/1969 | Germany | H03K 13/02 |
| 0172823 | 9/1985 | Japan | H03M 1/44 |
| 1601115 | 10/1978 | United Kingdom | H03M 1/00 |

Primary Examiner—Timothy P. Callahan
Assistant Examiner—Terry L. Englund
Attorney, Agent, or Firm—Hale and Dorr

[57] ABSTRACT

A differential amplifier operating as a magnitude amplifier may be used in a serial-type A/D converter. The differential amplifier uses complementary differential emitter pairs for folding and aligning a differential input signal. The differential input signal has a first signal and a second signal each of which is fed to one of two input circuits. One input circuit includes a bipolar npn transistor and a current sink and the other includes a bipolar pnp transistor and a current source. The outputs of the input npn transistors feed a differential pair of output pnp transistors. The emitters of the output pnp transistors are coupled, with the signal on the emitters following the lower of the differential input signals. The outputs of the input pnp transistors feed a differential pair of output npn transistors. The emitters of the output npn transistors also are coupled, with the signal on the emitters following the inputs in a predetermined manner. The results are folded signals at the outputs of the output transistors that are aligned by offset circuits.

24 Claims, 3 Drawing Sheets

ANALOG TO DIGITAL CONVERTER USING COMPLEMENTARY DIFFERENTIAL EMITTER PAIRS

This invention was made with Government support under contract SC0014-89-0024 awarded by the Air Force. The Government has certain rights in the invention.

FIELD OF THE INVENTION

The present invention relates to analog-to-digital converters. More specifically, the present invention relates to high speed converters in which the analog signal is converted first to Gray scale code signals and then to binary signals.

BACKGROUND OF THE INVENTION

There are a variety of analog-to-digital ("A/D") converters. For example, there are parallel encoder (or flash) A/D converters, multistage A/D converters, successive approximation A/D converters, voltage-to-frequency A/D converters, dual-ramp A/D converters, and staircase A/D converters. There is such a variety because the need for converters has heightened with the advent of single-chip large scale integration ("LSI") microprocessors. In fact, in some cases, it is desirable to include such converters on the same chip with the microprocessor.

In many cases, there is the desire to have very fast conversion to maintain the speed of the overall system. The types of A/D converters typically used in these situations have been flash and multistage A/D converters. As larger and larger flash A/D converters were being constructed, the resulting large dies had a great deal of parasitics that had to be driven. This forced the technology in the opposite direction, which was to make the A/D converters smaller and smaller. This brought about the advent of the consideration of replacing flash and multistage flash A/D converters with serial-type A/D converters because in many ways they were easier to construct on a chip than multistage flash A/D converters and, in some cases, achieve the speed off flash A/D converters at considerably less power.

Serial-type A/D converters typically convert analog signals first into Gray scale code and then into binary code. They are configured to have a series of cascaded analog cells to which the Gray scale code-to-binary processing system connects. Each cell of the series of cascaded analog cells has a folding cell that will process the differential input signals, $V_{INN}$ and $V_{IN}$, according to FIG. 1A.

The signals input to the differential input of the folding cell are shown in FIG. 1A. As $V_{IN}$ increases and $V_{INN}$ decreases, there is a single crossing at 100. This is the input level where the comparator of the folding cell is tripped and the $V_{IN}$ and $V_{INN}$ signals are folded to form the intermediate signals $V_{MAG}$ and $V_{MAGN}$ that are shown in FIG. 1B. A Gray scale digital word is derived from the outputs of the comparator. These intermediate signals are output from the current switching portion of the folding cell. When $V_{MAG}$ and $V_{MAGN}$ are folded as shown in FIG. 1B, the folded signals converge but do not cross, as shown at 102.

In order to obtain the desired $V_O$ and $V_{ON}$ outputs for input to the next stage, it is necessary to further process the $V_{MAG}$ and $V_{MAGN}$ signals. The $V_{MAG}$ signal must be positive offset one-quarter of full scale and the $V_{MAGN}$ signal must be negative offset one quarter of full scale to align the signals. Once the offset has been applied, the alignment shown in FIG. 1C results. This alignment has crossing points at 104 and 106. Thereafter, the $V_O$ and $V_{ON}$ signals are input to the next stage of the serial-type A/D converter.

Since the analog folding is done independently from the digital Gray scale outputs all digital latching can be done in parallel.

The folding cells of serial-type A/D converters have taken many configurations, one of which is a magnitude amplifier ("magamp") with offset circuitry that either is incorporated directly as part of the magamp or is separate circuitry that connects to the magamp. In order to maximize the speed of the conversion, it is necessary to design the magamps to operate as fast as possible.

The speed of the magamp rests in many cases on the operation of the folding cell. This speed also is affected by the ability of the input transistors to process the input signals. Therefore, an improvement of the configuration of the input transistors can increase the speed of the magamp.

The present invention provides a faster magamp, as will be described in detail in the remainder of the specification, referring to the drawings.

SUMMARY OF THE INVENTION

The present invention is an improved differential input amplifier for use as a magamp that uses complementary differential emitter pairs. It may be used in a serial-type A/D converter.

The improved magamp of the present invention includes a differential input amplifier and offset circuitry that is connected to it. These elements may be implemented in a single integrated circuit chip or as separate discrete circuits in hardware.

In the differential amplifier, each of the signals of the differential input are fed to the bases of pnp input transistors and npn input transistors. The emitters of the npn input transistors feed the bases of a differential pair of emitter coupled output pnp transistors, and the emitters of the pnp input transistors feed the bases of a differential pair of emitter-coupled output npn transistors. The output emitter-coupled pnp transistors are used to produce the first output signal, $V_O$, and the output emitter-coupled npn transistors are used to produce the second output signal, $V_{ON}$.

The collector currents out of the emitter coupled output pnp transistors are also the comparator outputs of the Gray scale digital word. The emitter coupled output npn transistors also could have been used for the digital output.

When the A/D converter that includes a magamp with the differential amplifier of the present invention is powered up, the pnp and npn input transistors all will be conducting current at a predetermined current level. The control of the pnp and npn output transistors will be controlled by the voltages at the bases of these transistors that are connected to the emitters of the input transistors.

Therefore, while the first input signal, $V_{IN}$, is less than the second input signal, $V_{INN}$, the output pnp transistor associated with the first input side is biased to conduct and the output pnp transistor on the second input side is biased so that it will not conduct. As a result, the voltage at the node in the line that connects the emitters of the output pnp transistors follows the voltage of the first input signal. Similarly, the output npn transistor on the second input side is biased to conduct and the output npn transistor on the first input side is biased so that it will not conduct. As such, the voltage at the node in the line that connects the emitters of the output npn transistors follows the voltage of the second input signal.

When the first input signal is greater than the second input signal, the situation reverses. The voltage at the node in the line that connects the emitters of the output pnp transistors follows the voltage of the second input signal and the voltage at the node in the line that connects the emitters of the output npn transistors follows the voltage of the first input signal.

Through the process just described, the input signals are folded, creating signals at double the frequency of the input signals. The voltage at the node in the line that connects the emitters of the output pnp transistors remains below the mid-point of the full scale signal and the voltage at the node in the line that connects the emitters of the output npn transistors remains above the mid-point of the full-scale signal. The output signals are then aligned, for input to the next stage. Preferably, the outputs are aligned using resistors.

A desired number of magamps of this type can be cascaded to form a multi-bit converter. An example is the five bit converter shown in FIG. 2.

An object of the present invention is to provide an improved differential input amplifier for a magamp.

Another object of the present invention is to provide an improved differential input amplifier for a magamp using differential complementary emitter pairs that operates with increased speed.

DETAILED DESCRIPTION OF THE PRESENT INVENTION

The present invention is an improved differential input amplifier that may be used in a magamp of a stage of a serial A/D converter. This A/D converter may be an n-bit converter with n-1 magamps that incorporate the differential input amplifiers of the present invention.

Referring to FIGS. 1A, 1B, 1C, and 2, the use of the differential input amplifier of the present invention in a serial A/D converter will be described. A/D converter 110 includes cascaded magamps 112A, 112B, 112C, and 112D. Magamp 112A has $V_{IN}$ input 114A, which is supplied by line 122, and $V_{INN}$ input 116A, which is supplied by line 124. The outputs of magamp 112A, $V_O$ 118A and $V_{ON}$ 120A, are the folded and aligned versions of the input signals. They connect to $V_{IN}$ input 114B and $V_{INN}$ input 116B via lines 126 and 128, respectively of the next magamp, magamp 112B. Magamp 112A has B and BN outputs, 162A and 164A, respectively, which supply the Gray digital output word. Magamp 112B connects to magamp 112C in the same manner, via lines 130 and 132. Magamp 112C connects to magamp 112D in the same manner, via lines 134 and 136. Outputs of 112D connect to comparator 160.

Figure 3:
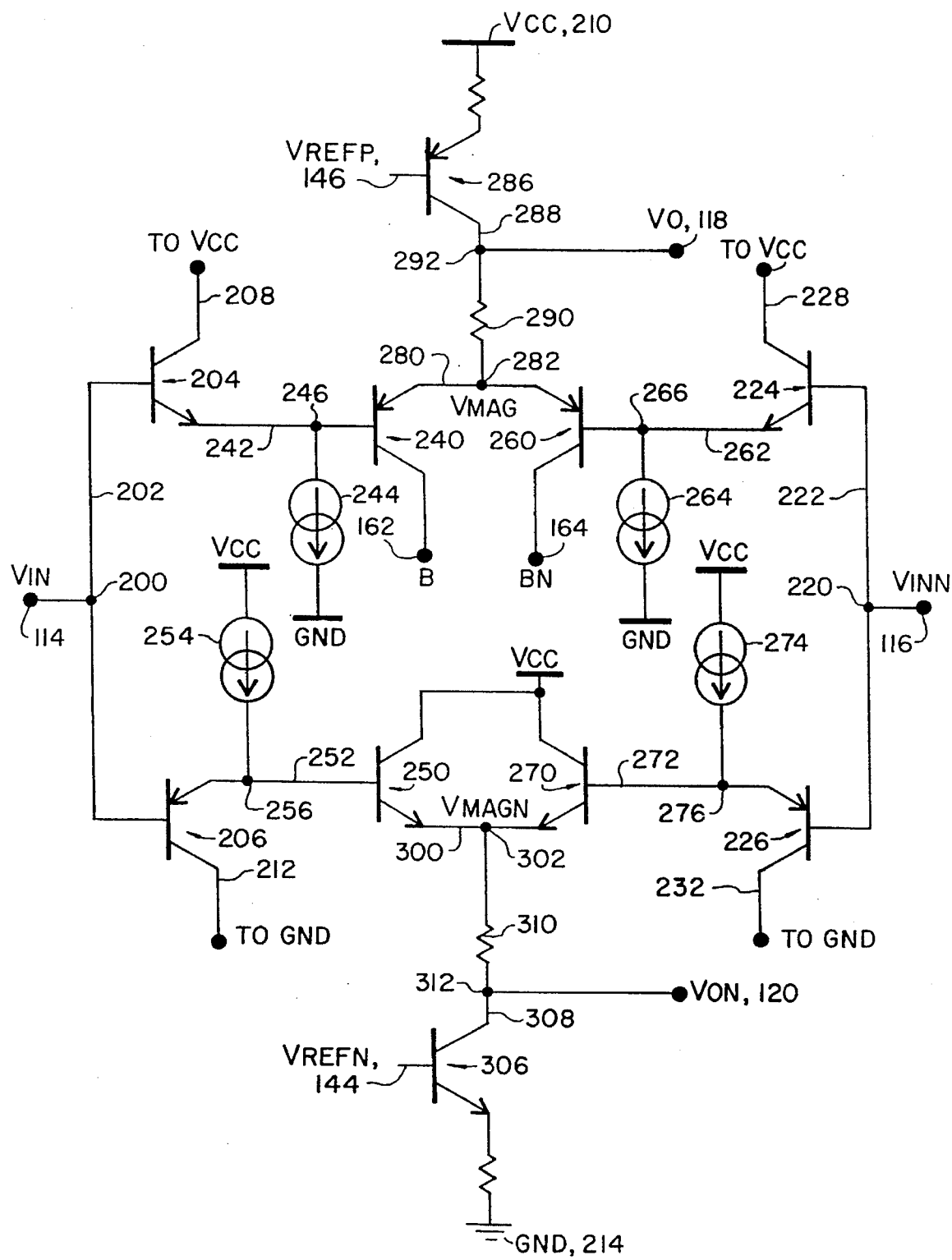
FIG. 3 is a block, schematic diagram of a magamp according to the present invention.

Through outputs $V_{RP}$ 154 and $V_{RN}$ 152, reference unit 156 provides reference voltages to set the current of the emitter coupled pairs (transistors 240 and 260, and 250 and 270) and the offset voltage across the offset resistors 290 and 310 of each magamp (shown in FIG. 3). Line 148 connects $V_{RN}$ 152 to the $V_{REFN}$ inputs 144A, 144B, 144C and 144D of magamps 112A, 112B, 112C, and 112D, respectively. Similarly, line 150 connects $V_{RP}$ 154 to the $V_{REFP}$ inputs 146A, 146B, 146C, and 146D of magamps 112A, 112B, 112C and 112D, respectively, At each stage, the full-scale swing of the input signal will be one-half the full-scale swing of the previous stage due to the folding.

The output signals B 162 and BN 164 at the four stages provide the first four bits of the Gray scale signal, which is converted to binary to complete the analog-to-digital conversion. The outputs B 166 and BN 168 of comparator 160 provide the fifth bit.

The operation of the magamps shown in FIG. 3 will now be described. Since the construction and operation of each of the magamps is substantially the same, the description of magamp 112A that follows applies equally to the other magamps unless indicated to the contrary.

Input signal $V_{IN}$ 114 connects to node 200 on line 202. Line 202 connects to the bases of input npn transistor 204 and input pnp transistor 206. The collector of input npn transistor 204 is connected to line 208, which is coupled to power supply, $V_{CC}$ 210. The collector of input pnp transistor 206 is connected to line 212, which is coupled to ground GND 214.

Similarly, input signal $V_{INN}$ 116 connects to node 220 on line 222. Line 222 connects to the bases of input npn transistor 224 and input pnp transistor 226. The collectors of input transistors 224 and 226 are coupled to $V_{CC}$ 210 and GND 214 through lines 228 and 232, respectively.

The emitter of input npn transistor 204 is connected to the base of output pnp transistor 240 via line 242. Current sink 244 connects to line 242 at node 246, and to GND 214. The emitter of input pnp transistor 206 is connected to the base of output npn transistor 250 via line 252. Current source 254 connects to line 252 at node 256 and to $V_{CC}$ 210.

The emitter of input transistor 224 is connected to the base of output pnp transistor 260 and to current sink 264 in a similar manner, via line 262 and node 266; and in the same manner the emitter of input transistor 226 is connected to output npn transistor 270 and to current source 274 via line 272 and node 276.

The emitters of output pnp transistors 240 and 260 are tied via line 280. $V_{MAG}$ node 282, disposed in line 280, provides the signal shown in FIG. 1B in response to signals $V_{IN}$ and $V_{INN}$ (of FIG. 1A) being input at $V_{IN}$ 114 and $V_{INN}$ 116, respectively. The collectors of output pnp transistors 240 and 260 connect to B 162 and BN 164, respectively.

$V_{CC}$ 210 connects to $V_{MAG}$ 282 through pnp transistor 286, line 288, and resistor 290. The base of pnp transistor 286 connects to $V_{REFP}$ 146. Node 292, disposed in line 288, provides output $V_O$ 118. The resistance of resistor 290 is selected to have a voltage drop of one fourth of the full scale range of the magamp inputs $V_{IN}$ 114 and $V_{INN}$ 116. Thus, the output voltage $V_O$ 118 is shifted up one fourth the full scale from $V_{MAG}$ 282. In a serial A/D converter, the full scale range of each magamp is one half the full scale range of the previous magamp. Consequently, if resistor 290 of the first stage has a value R, the value of resistor 290 at the n-th stage is given by:

$$R_n = \frac{R}{2^{n-1}}$$

The emitters of output npn transistors 250 and 270 are tied via line 300. $V_{MAGN}$ node 302, disposed in line 300, provides the signal shown in FIG. 1B in response to signals $V_{IN}$ and $V_{INN}$ (of FIG. 1A) being input at $V_{IN}$ 114 and $V_{INN}$ 116, respectively. The collectors of output npn transistors 250 and 270 connect to $V_{CC}$.

GND 214 connects to $V_{MAGN}$ 302 through npn transistor 306, line 308, and resistor 310. The base of npn transistor 306 connects to $V_{REFN}$ 144. Node 312, disposed in line 308, provides output $V_{ON}$ 120. The value of resistor 310 is the same as resistor 290. Like resistor 290, the voltage drop across resistor 310 is one fourth of the full scale range of the magamp inputs $V_{IN}$ 114 and $V_{INN}$ 116. Through this offset, output voltage $V_{ON}$ 120 is shifted down one fourth the full scale range from $V_{MAGN}$ 302.

Figure 1A:
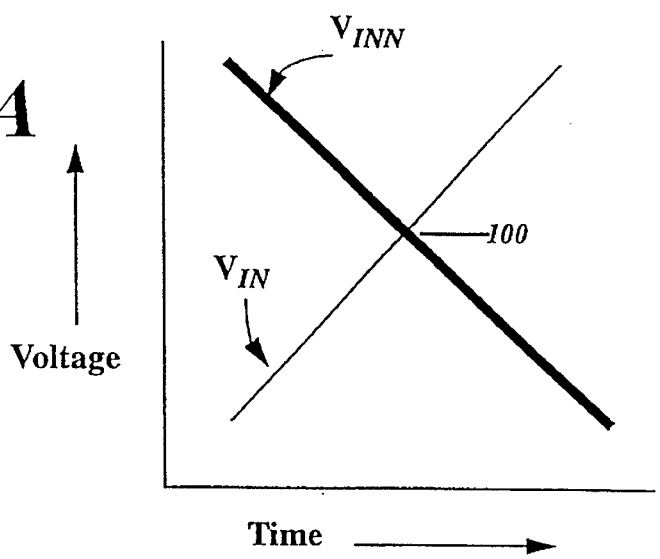
FIG. 1A is a graph of inputs to a serial-type A/D converter that has a folding cell.
Figure 1B:
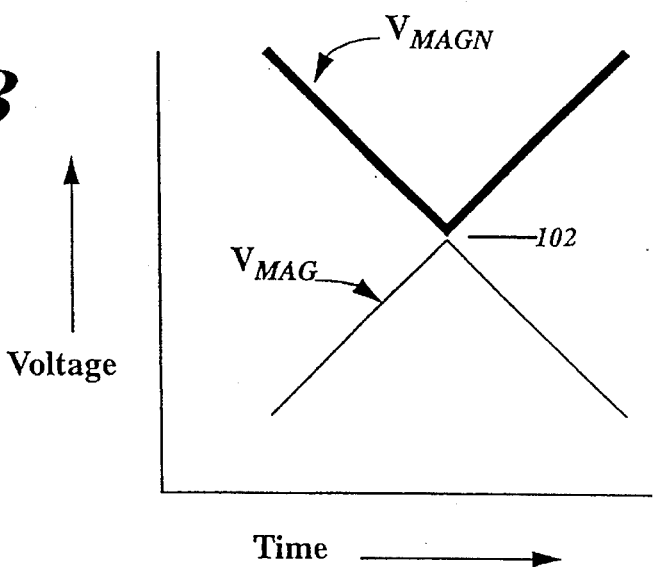
FIG. 1B is a graph of the intermediate folded signals of a serial-type A/D converter that has a folding cell.
Figure 1C:
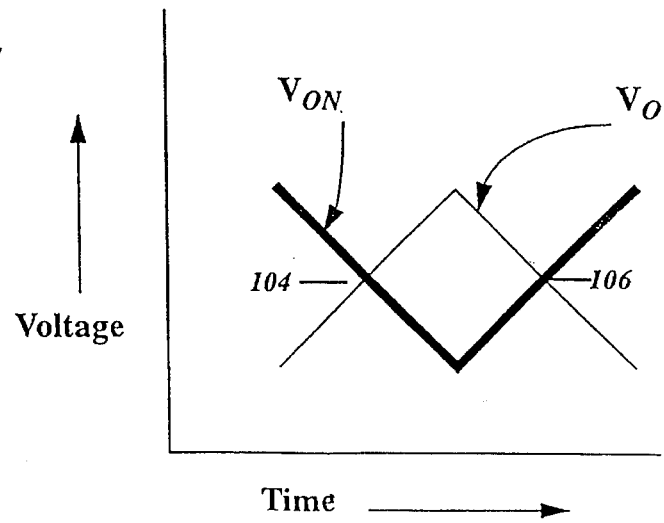
FIG. 1C is a graph of outputs of a serial-type A/D converter that has a folding cell and such outputs have been aligned for input to a next stage of the A/D converter.
Figure 2:
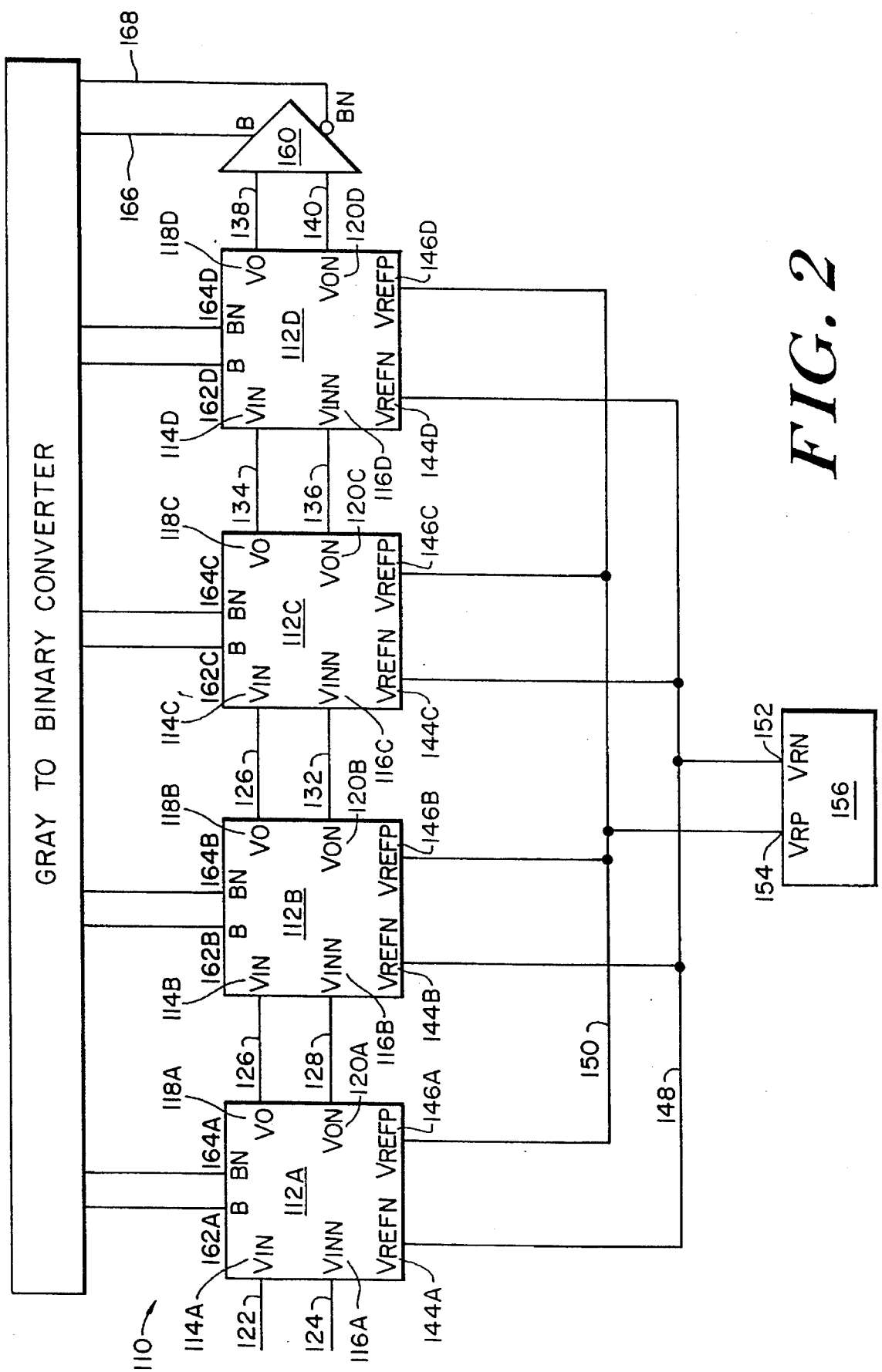
FIG. 2 is a block diagram of a 5-bit A/D converter according to the present invention.

The combination of the one fourth scale shifts in $V_O$ 118 and $V_{ON}$ 120 provides a combined offset of one half the full scale range, so that outputs $V_O$ 118 and $V_{ON}$ 120 align as shown in FIG. 1C.

The full-scale range of input signals $V_{IN}$ 114 and $V_{INN}$ 116 is sufficiently less than $V_{CC}$ 210 and greater than GND 214 that, with current sources 254 and 274 and current sinks 244 and 264, input transistors 204, 224, 206, and 226 always remain biased to conduct.

When $V_{IN}$ 114 is lower than $V_{INN}$ 116, such as when $V_{IN}$ 114 is first ramping up and $V_{INN}$ 116 is first ramping down, output transistors 240 and 270 are biased to conduct and output transistors 250 and 260 cease to conduct. Similarly, when $V_{INN}$ 116 is lower than $V_{IN}$ 114, output transistors 250 and 260 are biased to conduct and output transistors 240 and 270 cease to conduct. When $V_{IN}$ 114 is approximately equal to $V_{INN}$ 116, all four output transistors will be biased to conduct. This is the point where the slopes of the output signals change. This is also the point where the collector currents of output transistors 240 and 260 connecting to B 162 and BN 164 are equal, and a change in the Gray scale word occurs.

The emitters of each of the input transistors 204, 206, 224, and 226 follow the base voltages of those transistors. Output transistors 240, 250, 260, and 270 conduct according to the voltages of $V_{IN}$ 114 and $V_{INN}$ 116, as discussed. Because the input transistors are always biased to conduct, and from the operation of current sources 254 and 274 and sinks 244 and 264, output transistors 240, 250, 260, and 270 switch very quickly. The emitters of the emitter-coupled output transistors 240 and 260, and 250 and 270, follow the base voltage of whichever of the emitter-coupled output transistors is biased to conduct. Thus, the signal at $V_{MAG}$ 282 follows $V_{IN}$ 114 when $V_{IN}$ 114 is less than $V_{INN}$ 116 and follows $V_{INN}$ 116 when $V_{IN}$ 114 is greater than $V_{INN}$ 116. The voltage drops across the base-emitter junctions of the input npn transistors 204 or 224 and output pnp transistors 240 and 260 offset, so that the signal at $V_{MAG}$ 282 is the same as the lesser of $V_{IN}$ 114 or $V_{INN}$ 116.

In the same manner, $V_{MAGN}$ 302 is the same as the higher of $V_{IN}$ 114 and $V_{INN}$ 116. Consequently, $V_{MAG}$ 282 and $V_{MAGN}$ 302 are folded versions of the input signals, as shown in FIGS. 1A and 1B. The full-scale magnitude of the folded signals is one-half the full-scale magnitude of the input signals. The two offsets, described above, provide outputs $V_O$ 118 and $V_{ON}$ 120, which are aligned and centered the same as the input signals $V_{IN}$ 114 and $V_{INN}$ 116.

When the magamp is used in a serial A/D converter, outputs $V_O$ 118 and $V_{ON}$ 120 can be used as inputs to the next magamp.

The collector currents of output pnp transistors 240 and 260 supply the equivalent Gray digital word of the magamp via B 162 and BN 164. Output transistors 240 and 260 act as the comparator in each magamp. Because the nodes B 162 and BN 164 are not in the analog path, the latching in the Gray to binary converters can all be done in parallel.

While there have been shown and described examples of the present invention, it will be readily apparent to those skilled in the art that various changes and modifications may be made therein without departing from the scope of the invention as defined by the appended claims. Accordingly, the invention is limited only by the following claims and equivalents thereto.

I claim:

1. A differential amplifier comprising:
   a first differential input circuit for receiving a differential analog input, the first differential input circuit having a first branch and a second branch;
   a second differential input circuit for receiving the differential analog input, the second differential input circuit having a third branch and a fourth branch, with an input to the first branch coupled to an input to the third branch, and an input to the second branch coupled to an input to the fourth branch;
   a first differential pair of first and second transistors, each of the first and second transistors having a control lead coupled to the respective first branch and second branch to receive a signal therefrom, the first differential pair for folding the differential analog input and providing a first folded signal; and
   a second differential pair of third and fourth transistors, each of the third and fourth transistors having a control lead coupled to the respective third branch and fourth branch to receive a signal therefrom, the second differential pair for folding the differential analog input and providing a second folded signal, with the second folded signal being a mirror image of the first folded signal.

2. The differential amplifier as in claim 1, further comprising a first offset circuit coupled to an output of the first differential pair and a second offset circuit coupled to an output of the second differential pair, the first offset circuit for aligning the outputs of the first and second differential pairs such that a magnitude of one of the first and second folded signals is varied relative to the other to reduce an overall magnitude range of the outputs of the first and second folded signals.

3. The differential amplifier as in claim 2, wherein the first differential pair of transistors provides outputs for a digital Gray scale word.

4. The differential, amplifier as in claim 2, wherein the first branch includes a first input transistor for receiving a first signal of the differential analog input and a first current sink.

5. The differential amplifier as in claim 4, wherein the first input transistor is a bipolar npn transistor.

6. The differential amplifier as in claim 5, wherein the second branch includes a second input transistor for receiving a second signal of the differential analog input and a second current sink.

7. The differential amplifier as in claim 6, wherein the second input transistor is a bipolar npn transistor.

8. The differential amplifier as in claim 7, wherein the third branch includes a third input transistor for receiving the first signal of the differential analog input and a first current source.

9. The differential amplifier as in claim 8, wherein the third input transistor is a bipolar pnp transistor.

10. The differential amplifier as in claim 9, wherein the fourth branch includes a fourth input transistor for receiving the second signal of the differential analog input and a second current source.

11. The differential amplifier as in claim 10, wherein the fourth input transistor is a bipolar pnp transistor.

12. The differential amplifier as in claim 2, wherein the first differential pair of transistors includes first and second bipolar pnp transistors with coupled emitters.

13. The differential amplifier as in claim 12, wherein the first offset circuit includes a first offset resistor having a first terminal connected to the coupled emitters of the first differential pair of transistors and a second terminal connected to a first current source.

14. The differential amplifier as in claim 13, wherein the second differential pair of transistors includes first and second bipolar npn transistors with coupled emitters.

15. The differential amplifier as in claim 14, wherein the second offset circuit includes a second offset resistor having a first terminal connected to the coupled emitters of the second differential pair of transistors and a second terminal connected to a current sink.

16. The differential amplifier as in claim 11, wherein the first differential pair of transistors includes bipolar pnp transistors with coupled emitters;

the first offset circuit includes a first offset resistor having a first terminal connected to the coupled emitters of the first differential pair of transistors, and a third current source connected between a second terminal of the first offset resistor and a power supply voltage;

the second differential pair of transistors includes first and second bipolar npn output transistors having coupled emitters; and the second offset circuit includes a second offset resistor having a first terminal connected to the coupled emitters of the second differential pair of transistors and a third current sink connected between a second terminal of the second offset resistor and ground.

17. An amplifier comprising:

first and second transistors having control leads for receiving a differential analog input and for providing respective first and second signals;

third and fourth transistors for receiving at control leads the differential analog input and for providing respective third and fourth signals, an input to the first transistor coupled to an input to the third transistor, and an input to the second transistor coupled to an input to the fourth transistor;

fifth and sixth transistors coupled together on a first side and having control leads for receiving the first and second signals, respectively, and for providing a first folded signal on the first side; and seventh and eighth transistors coupled together on one side and having control leads for receiving the third and fourth signals, respectively, and for providing on the one side a second folded signal that is a mirror image of the first folded signal.

18. The amplifier of claim 17, where the transistors are bipolar transistors.

19. The amplifier of claim 17, wherein the first, second, seventh and eighth transistors are bipolar npn transistors, and the third, fourth, fifth, and sixth transistors are bipolar pnp transistors.

20. The amplifier of claim 17, wherein the first, second, third, and fourth transistors each has an emitter coupled to a respective current source such that each of the first, second, third, and fourth transistors conducts continually.

21. The amplifier of claim 20, wherein the first and second transistors are bipolar npn transistors and the respective current sources sink current, and wherein the third and fourth transistors are bipolar pnp transistors and the respective current sources source current.

22. The amplifier of claims 17, wherein the amplifier is combined with a gray-to-binary converter, wherein the amplifier provides a signal to the converter on a second side of the fifth and sixth transistors.

23. An analog to digital converter comprising:

a first differential amplifier including:
a first differential input circuit for receiving a differential analog input, the first differential input circuit having a first branch and a second branch,
a second differential input circuit for receiving the differential analog input, the second differential input circuit having a third branch and a fourth branch, an input to the first branch coupled to an input to the third branch, and an input to the second branch coupled to an input to the fourth branch,
a first differential pair of first and second transistors, each of the first and second transistors having a control lead coupled to the respective first branch and second branch to receive a signal therefrom, the first differential pair for folding the differential analog input and providing a first folded signal, and
a second differential pair of third and fourth transistors, each of the third and fourth transistors having a control lead coupled to the respective third branch and the fourth branch to receive a signal therefrom, the second differential pair for folding the differential analog input and providing a second folded signal, with the second folded signal being a mirror image of the first folded signal;

a second differential amplifier including:
a third differential input circuit for receiving the first and second folded signals as a second differential analog input, the third differential input circuit having a first branch and a second branch,
a fourth differential input circuit for receiving the second differential analog input, the fourth differential input circuit having a third branch and a fourth branch, the first folded signal being provided as an input to the first branch and to the third branch, and the second folded signal being provided as an input to the second branch and to the fourth branch,
a third differential pair of first and second transistors, each of the first and second transistors having a control lead coupled to the respective first branch and second branch of the third differential input circuit to receive a signal therefrom, the third differential pair for folding the second differential analog input and providing a new first folded signal, and
a fourth differential pair of third and fourth transistors, each of the third and fourth transistors having a control lead coupled to the respective third branch and fourth branch of the fourth differential input circuit to receive a signal therefrom, the fourth differential pair for folding the second differential analog input and providing a new second folded signal, with the new second folded signal being a mirror image of the new first folded signal; and a converter coupled to the first and second differential amplifiers for receiving respective signals from the first and third differential pairs of the first and second differential amplifiers, respectively, and for providing parallel output binary signals.

24. The converter of claim 23, wherein each of the first and third differential pairs includes emitter-coupled pnp transistors with collectors for providing gray word signals and emitters for providing the first folded signal and the new first folded signal, respectively.

* * * * *